United States Patent
Masamoto et al.

(10) Patent No.: US 10,280,518 B2
(45) Date of Patent: May 7, 2019

(54) ETCHING LIQUID COMPOSITION AND ETCHING METHOD

(71) Applicant: ADEKA CORPORATION, Tokyo (JP)

(72) Inventors: Yuji Masamoto, Tokyo (JP); Yoshihide Saio, Tokyo (JP); Tamami Aoki, Tokyo (JP)

(73) Assignee: ADEKA CORPORATION, Tokyo (JP)

(*) Notice: Subject to any disclaimer, the term of this patent is extended or adjusted under 35 U.S.C. 154(b) by 0 days.

(21) Appl. No.: 15/769,217

(22) PCT Filed: Aug. 22, 2016

(86) PCT No.: PCT/JP2016/074378
§ 371 (c)(1),
(2) Date: Apr. 18, 2018

(87) PCT Pub. No.: WO2017/068849
PCT Pub. Date: Apr. 27, 2017

(65) Prior Publication Data
US 2018/0298501 A1  Oct. 18, 2018

(30) Foreign Application Priority Data
Oct. 23, 2015 (JP) ................. 2015-209028

(51) Int. Cl.
C23F 1/18 (2006.01)
H01L 21/308 (2006.01)
H01L 21/306 (2006.01)
H05K 3/06 (2006.01)

(52) U.S. Cl.
CPC .............. *C23F 1/18* (2013.01); *H01L 21/306* (2013.01); *H01L 21/308* (2013.01); *H05K 3/06* (2013.01)

(58) Field of Classification Search
None
See application file for complete search history.

(56) References Cited

U.S. PATENT DOCUMENTS

| | | | |
|---|---|---|---|
| 2004/0110374 A1* | 6/2004 | Verbunt | C23C 18/1653 438/689 |
| 2014/0038420 A1* | 2/2014 | Chen | H01L 21/32134 438/754 |
| 2015/0025234 A1* | 1/2015 | Ragaglia | A61K 31/7032 536/123.1 |

FOREIGN PATENT DOCUMENTS

| | | |
|---|---|---|
| JP | 2006-11953 | 4/2006 |
| JP | 2009-79284 | 4/2009 |
| JP | 2009-231427 | 10/2009 |
| JP | 2010-537231 | 12/2010 |
| JP | 2013-89731 | 5/2013 |
| WO | 2006/030718 | 3/2006 |
| WO | 2013/136624 | 9/2013 |

OTHER PUBLICATIONS

International Search Report dated Sep. 20, 2016 in International (PCT) Application No. PCT/JP2016/074378.

* cited by examiner

*Primary Examiner* — Allan W. Olsen
(74) *Attorney, Agent, or Firm* — Wenderoth, Lind & Ponack, L.L.P.

(57) ABSTRACT

The present invention provides an etching liquid composition consisting of an aqueous solution that contains (A) 0.1 to 30 mass % of at least one type of oxidizing agent selected from among ferric ions and cupric ions; (B) 0.1 to 20 mass % of hydrogen chloride, and an etching method using it.

8 Claims, No Drawings

US 10,280,518 B2

ETCHING LIQUID COMPOSITION AND ETCHING METHOD

TECHNICAL FIELD

This invention relates to an etching liquid composition and an etching method. More specifically, this invention relates to an etching liquid composition and an etching method, which are used for etching a coating film that includes a copper-based layer.

BACKGROUND ART

A variety of techniques are known for wet etching coating films that include copper-based layers when forming copper wiring patterns and the like, and a variety of techniques are also known for wet etching coating films that include indium oxide-based layers when forming transparent electrode patterns and the like. Because these techniques are inexpensive and allow favorable etching speeds, aqueous solutions containing hydrochloric acid are often used as etching liquid compositions.

For example, as an etching liquid composition used for forming a copper wiring pattern, Patent Document 1 discloses an etching liquid composition consisting of an aqueous solution that contains a cupric ion source, hydrochloric acid (hydrogen chloride), an azole having only nitrogen atoms as heteroatoms in the ring, and at least one aromatic compound selected from among phenol compounds and aromatic amine compounds. In addition, Patent Document 2 discloses an etching liquid composition consisting of an aqueous solution that contains ferric chloride and hydrochloric acid as an etching liquid composition used for forming a transparent electrode pattern including indium-tin oxide (hereinafter abbreviated to as "ITO" in some cases) or the like.

Meanwhile, as an etching liquid composition that does not use hydrochloric acid, Patent Document 3, for example, discloses an etching liquid composition consisting of an aqueous solution that contains cupric ions, an organic acid, halogen ions, an azole and a polyalkylene glycol.

CITATION LIST

Patent Document

[Patent Document 1] Japanese Patent Application Publication No. 2009-79284
[Patent Document 2] Japanese Patent Application Publication No. 2009-231427
[Patent Document 3] Japanese Patent Application Publication No. 2006-111953

SUMMARY OF INVENTION

Technical Problem

However, the etching liquid compositions disclosed in the documents mentioned above exhibit low stability and generate precipitates if left to stand even for a short period of time, and cannot therefore be used for etching in some cases. In addition, depending on the type of coating film to be etched (hereinafter abbreviated to as a "coating film being etched" in some cases), the etching liquid compositions disclosed in the documents mentioned above may not, in some cases, be able to produce a wiring pattern having the desired dimensional accuracy. For example, in cases where a coating film that includes a copper-based layer is etched, a significant difference occurs between the width of a resist pattern formed on the coating film and the width of a wiring pattern obtained by the etching, and it is not possible to form a wiring pattern having the desired width. This problem is particularly pronounced in cases where a multilayer coating film that includes an indium oxide-based layer and a copper-based layer is etched. Moreover, in the present specification, "width of a wiring pattern" means the width of the top part of a wiring pattern.

Therefore, this invention has been developed in order to solve problems such as those mentioned above, and the purpose of this invention is to provide an etching liquid composition and an etching method that allow the formation of a wiring pattern that has the desired dimensional accuracy, while also providing high stability and impeding the generation of precipitates.

Solution to Problem

As a result of diligent research, the inventors of this invention found that an aqueous solution that contains prescribed proportions of (A) at least one type of oxidizing agent selected from among ferric ions and cupric ions; (B) hydrogen chloride; and (C) 1,3-dihydroxybenzene exhibited characteristics suitable for an etching composition to be used for etching a coating film that includes a copper-based layer and could solve the problem mentioned above, and thereby completed this invention.

That is, this invention is an etching liquid composition, used for etching a coating film that includes a copper-based layer, this etching liquid composition consisting of an aqueous solution that contains: (A) 0.1 to 30 mass % of at least one type of oxidizing agent selected from among ferric ions and cupric ions; (B) 0.1 to 20 mass % of hydrogen chloride; and (C) 0.01 to 25 mass % of 1,3-dihydroxybenzene.

In addition, this invention is an etching method for etching a coating film, which includes a copper-based layer formed on a base, using an etching liquid composition consisting of an aqueous solution that contains: (A) 0.1 to 30 mass % of at least one type of oxidizing agent selected from among ferric ions and cupric ions; (B) 0.1 to 20 mass % of hydrogen chloride; and (C) 0.01 to 25 mass % of 1,3-dihydroxybenzene.

Advantageous Effects of Invention

According to this invention, it is possible to provide an etching liquid composition and an etching method that allow the formation of a wiring pattern that has the desired dimensional accuracy, while also providing high stability and impeding the generation of precipitates.

DESCRIPTION OF EMBODIMENTS

Detailed explanations will now be given of preferred embodiments of the etching liquid composition and the etching method of this invention.

The etching liquid composition of this invention consists of an aqueous solution that contains (A) at least one type of oxidizing agent selected from among ferric ions and cupric ions; (B) hydrogen chloride; and (C) 1,3-dihydroxybenzene.

The at least one type of oxidizing agent selected from among ferric ions and cupric ions (A) used in the etching liquid composition of this invention (hereinafter abbreviated to component (A) in some cases) is a component that imparts the function of etching by oxidizing a coating film that includes a copper-based layer. The component (A) can use ferric ions or cupric ions in isolation, or a mixture thereof.

Ferric ions and cupric ions can be incorporated in the etching liquid composition by blending iron (III) compounds and copper (II) compounds as ion sources.

Iron (III) compounds are not particularly limited, and it is possible to use, for example, iron (III) chloride, iron (III) bromide, iron (III) iodide, iron (III) sulfate, iron (III) nitrate, iron (III) acetate, or the like. In addition, copper (II) compounds are not particularly limited, and it is possible to use, for example, copper (II) chloride, copper (II) bromide, copper (II) sulfate, copper (II) hydroxide, or the like. It is possible to use one of these compounds in isolation, or a mixture of two or more types thereof. In addition, of the compounds listed above, iron (III) sulfate, iron (III) chloride, copper (II) chloride and copper (II) sulfate are preferred, and iron (III) chloride and copper (II) chloride are more preferred, from the perspectives of stability of the etching liquid composition and being able to control the etching speed.

The concentration of the component (A) in the etching liquid composition of this invention is adjusted as appropriate according to the thickness and width of the coating film being etched, but is 0.1 to 30 mass %, preferably 0.3 to 28 mass %, and more preferably 0.5 to 25 mass %, in terms of ions. Here, in the present specification, "in terms of ions" means in terms of ferric ions or cupric ions in cases where ferric ions or cupric ions are used in isolation, but means in terms of both ferric ions and cupric ions in cases where ferric ions and cupric ions are used in combination. If the concentration of the component (A) is lower than 0.1 mass %, it may not be possible to achieve a satisfactory etching speed. Meanwhile, if the concentration of the component (A) exceeds 30 mass %, the 1,3-dihydroxybenzene (C) may become insoluble in the etching liquid composition.

The hydrogen chloride (B) used in the etching liquid composition of this invention (hereinafter abbreviated to component (B) in some cases) is a component that imparts the function of dissolving the oxidized coating film, the function of stabilizing an oxidizing agent (for example, component (A)) in the etching liquid composition, the function of improving etching speed, and the like.

The concentration of the component (B) in the etching liquid composition of this invention is adjusted as appropriate according to the thickness and width of the coating film being etched, but is 0.1 to 20 mass %, preferably 0.3 to 18 mass %, and more preferably 0.5 to 15 mass %. If the concentration of the component (B) is lower than 0.1 mass %, it may not be possible to achieve a satisfactory etching speed. Meanwhile, even if the concentration of the component (B) exceeds 20 mass %, no improvement in etching speed can be expected, but rather, defects such as equipment components becoming corroded can occur.

The 1,3-dihydroxybenzene (C) used in the etching liquid composition of this invention (hereinafter abbreviated to component (C) in some cases) is a component that imparts the function of increasing the stability of the etching liquid composition and preventing the generation of precipitates, the function of improving etching performance, and the like.

The concentration of the component (C) in the etching liquid composition of this invention is adjusted as appropriate according to the thickness and width of the coating film being etched, but is 0.01 to 25 mass %, preferably 0.01 to 23 mass %, and more preferably 0.01 to 20 mass %. If the concentration of the component (C) is less than 0.01 mass %, the functions mentioned above cannot be satisfactorily exhibited. Meanwhile, even if the concentration of the component (C) exceeds 25 mass %, the functions mentioned above are not necessarily improved and the increased usage quantity of the component (C) leads to higher costs.

The etching liquid composition of this invention is an aqueous solution that contains components (A) to (C) mentioned above. Therefore, the etching liquid composition of this invention contains water in addition to components (A) to (C) mentioned above.

The type of water used in the etching liquid composition of this invention is not particularly limited, but it is preferable to use water from which ionic substances and impurities have been removed, such as ion exchanged water, pure water or ultra-pure water.

The etching liquid composition of this invention may be an aqueous solution consisting of components (A) to (C), but may also be an aqueous solution consisting essentially of components (A) to (C). That is, well known additives used in this technical field, other than the components mentioned above, may be blended in the etching liquid composition of this invention as long as the advantageous effect of this invention is not impaired.

Additives able to be used in the etching liquid composition of this invention are not particularly limited, but examples thereof include stabilizers for the etching liquid composition, solubilizing agents for the components, antifoaming agents, pH-adjusting agents, specific gravity modifiers, viscosity modifiers, wettability-improving agents, chelating agents, oxidizing agents, reducing agents and surfactants. It is possible to use one of these additives in isolation, or a combination of two or more types thereof. In cases where these additives are used, the concentration of the additives in the etching liquid composition of this invention is generally 0.001 to 50 mass %.

Examples of chelating agents include aminocarboxylic acid-based chelating agents such as ethylenediamine tetraacetic acid, diethylenetriamine pentaacetic acid, triethylenetetramine hexaacetic acid, tetraethylenepentamine heptaacetic acid, pentaethylenehexamine octaacetic acid, nitrilotriacetic acid and alkali metal salts (and preferably sodium salts) of these; phosphonic acid-based chelating agents such as hydroxyethylidene diphosphonic acid, nitrilotrismethylene phosphonic acid, phosphonobutane tricarboxylic acid and alkali metal salts (and preferably sodium salts) of these; and divalent or higher carboxylic acid compounds such as oxalic acid, malonic acid, succinic acid, glutaric acid, adipic acid, pimelic acid, maleic acid, fumaric acid, malic acid, tartaric acid, citric acid and anhydrides and alkali metal salts (and preferably sodium salts) of these, and monoanhydrides and dianhydrides obtained by dehydrating divalent or higher carboxylic acid compounds. In cases where a chelating agent is used, the concentration of the chelating agent in the etching liquid composition of this invention generally falls within the range 0.01 to 40 mass %.

A reducing agent can be used in cases where the etching speed of the etching liquid composition of this invention is high. Examples of reducing agents include copper chloride, ferrous chloride, copper powders and silver powders. In cases where a reducing agent is used, the concentration of the reducing agent in the etching liquid composition of this invention generally falls within the range 0.01 to 10 mass %.

It is possible to use a non-ionic surfactant, a cationic surfactant or an amphoteric surfactant as the surfactant.

Examples of non-ionic surfactants include polyoxyalkylene alkyl ethers, polyoxyalkylene alkenyl ethers, polyoxyethylene-polyoxypropylene alkyl ethers (the mode of addition of ethylene oxide and propylene oxide may be random or block-like), polyethylene glycol-propylene oxide adducts, polypropylene glycol-ethylene oxide adducts, random or block adducts of ethylene oxide and propylene oxide to alkylenediamines, glycerol fatty acid esters and ethylene oxide adducts thereof, sorbitan fatty acid esters, polyoxyethylene sorbitan fatty acid esters, alkylpolyglucosides, fatty acid monoethanolamides and ethylene oxide adducts thereof, fatty acid-N-methylmonoethanolamide and ethylene oxide adducts thereof, fatty acid diethanolamides and ethylene oxide adducts thereof, sucrose fatty acid esters, alkyl (poly)glycerol ethers, polyglycerol fatty acid esters, polyethylene glycol fatty acid esters, fatty acid methyl ester ethoxylates and N-long chain alkyl dimethylamine oxides. Of these, random or block adducts of ethylene oxide and propylene oxide to alkylenediamines result in favorable linearity of an obtained wiring pattern and favorable storage stability of the etching liquid composition of this invention, and are therefore preferred. In particular, among random or block adducts of ethylene oxide and propylene oxide to alkylenediamines, reverse type adducts are more preferred from the perspective of low foaming properties.

Examples of cationic surfactants include alkyl (or alkenyl) trimethyl ammonium salts, dialkyl (or alkenyl) dimethyl ammonium salts, alkyl (or alkenyl) quaternary ammonium salts, mono- or di-alkyl (or alkenyl) quaternary ammonium salts having an ether group, an ester group or an amide group, alkyl (or alkenyl) pyridinium salts, alkyl (or alkenyl) dimethylbenzyl ammonium salts, alkyl (or alkenyl) isoquinolinium salts, dialkyl (or alkenyl) morphonium salts, polyoxyethylene alkyl (or alkenyl) amines, alkyl (or alkenyl) amine salts, polyamine fatty acid derivatives, amyl alcohol fatty acid derivatives, benzalkonium chloride and benzethonium chloride.

Examples of amphoteric surfactants include carboxybetaines, sulfobetaines, phosphobetaines, amidoamino acids and imidazolinium betaine-based surfactants.

In cases where a surfactant is used, the concentration of the surfactant in the etching liquid composition of this invention generally falls within the range 0.001 to 10 mass %.

The etching liquid composition of this invention can be prepared by mixing the components mentioned above. The mixing method is not particularly limited, and a well-known mixing device should be used.

The etching liquid composition of this invention, which contains components such as those mentioned above, exhibits high stability and impedes the generation of precipitates, and therefore enables etching to be carried out continuously and stably.

The etching liquid composition of this invention can be used to etch a coating film that includes a copper-based layer. In cases where a conventional etching liquid composition was used to etch a coating film that includes a copper-based layer, a significant difference occurred between the width of a resist pattern formed on the coating film and the width of a wiring pattern obtained by the etching, and it was difficult to form a wiring pattern having the desired width, but by using the etching liquid composition of this invention, it is possible to solve this problem. That is, the etching liquid composition of this invention can form a wiring pattern having the desired dimensional accuracy. The advantageous effect achieved by using the etching liquid composition of this invention is particularly pronounced in cases where an etching target is a multilayer coating film that includes at least one indium oxide-based layer and at least one copper-based layer.

Here, in the present specification, "copper-based layer" means a layer that contains copper. For example, a layer that contains 10 to 100 mass % of copper can be used as a copper-based layer. Examples of copper-based layers include layers including at least one type selected from among metallic copper (Cu) and copper alloys such as copper-nickel-titanium alloys (CuNiTi) and copper-nickel alloys (CuNi).

In addition, in the present specification, "indium oxide-based layer" means a layer that contains indium oxide. For example, a layer that contains 10 to 100 mass % of indium oxide can be used as an indium oxide-based layer. Examples of indium oxide-based layers include layers including at least one type selected from among indium oxide ($In_2O_3$), indium-tin oxide (ITO) and indium-zinc oxide (IZO).

The number of indium oxide-based layers and copper-based layers in a multilayer coating film is not particularly limited, and it is possible to have one layer of each, or two or more layers of each. In addition, the order in which indium oxide-based layers and copper-based layers are laminated is not particularly limited, and it is possible for a multilayer coating film to include indium oxide-based layer (upper layer)/copper-based layer (lower layer) or copper-based layer (upper layer)/indium oxide-based layer (lower layer). Furthermore, a multilayer coating film may be one in which indium oxide-based layers and copper-based layers are alternately laminated (for example, indium oxide-based layer/copper-based layer/indium oxide-based layer, copper-based layer/indium oxide-based layer/copper-based layer, indium oxide-based layer/copper-based layer/indium oxide-based layer/copper-based layer, copper-based layer/indium oxide-based layer/copper-based layer/indium oxide-based layer, or the like).

Moreover, a multilayer coating film may contain layers other than indium oxide-based layers and copper-based layers as long as the advantageous effect of this invention is not impaired, but it is preferable for a multilayer coating film to be constituted only from at least one indium oxide-based layer and at least one copper-based layer.

A coating film that is an etching target is generally formed on a base. Bases are not particularly limited, and it is possible to use a base formed from a material that is commonly used in this technical field. Examples of constituent materials of base include glass, silicon, PP, PE and PET.

The etching liquid composition of this invention can form wiring patterns consisting of a variety of fine lines by etching a coating film formed on a base. In particular, the etching liquid composition of this invention enables one-step etching (collective etching) in cases where a multilayer coating film is etched. Therefore, instead of changing the type of etching liquid composition for each layer that constitutes a multilayer coating film, it is possible to simplify an etching process by not requiring selective etching to be carried out.

When carrying out etching, it is possible to form a wiring pattern by forming a resist pattern corresponding to a wiring pattern on a coating film, and detaching the resist pattern following etching. The type of resist is not particularly limited, and it is possible to use a photoresist such as a dry film resist.

Etching treatment using the etching liquid composition of this invention can be carried out using an ordinary well-known method. In addition, the etching method is not particularly limited, and it is possible to use a method such as a dipping method, a spraying method or a spinning method.

For example, in cases where a multilayer coating film including CuNi layer/Cu layer/ITO layer formed on a PET base is etched using a dipping type etching method, by immersing the base on which the multilayer coating film is formed in the etching liquid composition of this invention for a prescribed period of time, it is possible to etch in one step (collectively etch) the CuNi layer/Cu layer/ITO layer on the PET base.

Etching conditions are not particularly limited, and should be set as appropriate according to the type, shape and thickness of coating film that is the etching target.

For example, the etching temperature is preferably 10° C. to 60° C., and more preferably 30° C. to 50° C. Because the temperature of the etching liquid composition increases as a result of reaction heat, the temperature may, if necessary, be controlled by a publicly known means in order to maintain the temperature within the range mentioned above.

In addition, the etching duration is not particularly limited as long as the duration is sufficient for completely etching those parts of the coating film that are to be etched. For example, in cases where a coating film having a thickness of approximately 500 to 2000 Å is etched so as to form a wiring pattern on an electronic circuit board, etching should be carried out within the temperature range mentioned above for a duration of approximately 0.2 to 5 minutes.

The etching liquid composition and the etching method of this invention allow the formation of a wiring pattern that has the desired dimensional accuracy, while also providing high stability and impeding the generation of precipitates, and can therefore be advantageously used when forming electrodes, wires, and the like, in liquid crystal displays, plasma displays, touch panels, organic EL devices, solar cells, lighting fixtures, and the like.

EXAMPLES

This invention will now be explained in greater detail through the use of working examples and comparative examples, but this invention is in no way limited to these examples.

Working Examples 1 to 24

Etching liquid compositions were obtained by mixing the components shown in Table 1 at the blending proportions shown in Table 1. Moreover, water was a component of the etching liquid compositions in addition to the components shown in Table 1. In addition, the units for the blending proportions of the components shown in Table 1 are mass %, and the concentration of ferric chloride is the concentration in terms of ferric ions and the concentration of cupric chloride is the concentration in terms of cupric ions.

TABLE 1

| Working Example No. | Component (A) Ferric chloride | Component (A) Cupric chloride | Component (B) Hydrogen chloride | Component (C) 1,3-dihydroxy-benzene |
|---|---|---|---|---|
| 1 | 1 | — | 1 | 0.01 |
| 2 | 1 | — | 1 | 1 |
| 3 | 1 | — | 1 | 10 |
| 4 | 1 | — | 1 | 20 |
| 5 | 1 | — | 15 | 0.01 |
| 6 | 1 | — | 15 | 3 |
| 7 | 1 | — | 15 | 10 |
| 8 | 1 | — | 15 | 20 |
| 9 | 25 | — | 1 | 10 |
| 10 | 25 | — | 10 | 10 |
| 11 | 25 | — | 10 | 20 |
| 12 | — | 1 | 1 | 0.01 |
| 13 | — | 1 | 1 | 1 |

TABLE 1-continued

| Working Example No. | Component (A) Ferric chloride | Component (A) Cupric chloride | Component (B) Hydrogen chloride | Component (C) 1,3-dihydroxy-benzene |
|---|---|---|---|---|
| 14 | — | 1 | 1 | 10 |
| 15 | — | 1 | 1 | 20 |
| 16 | — | 1 | 15 | 0.01 |
| 17 | — | 1 | 15 | 1 |
| 18 | — | 1 | 15 | 10 |
| 19 | — | 1 | 15 | 20 |
| 20 | — | 25 | 1 | 1 |
| 21 | — | 25 | 1 | 10 |
| 22 | — | 25 | 1 | 20 |
| 23 | — | 25 | 10 | 5 |
| 24 | — | 25 | 10 | 10 |

Comparative Examples 1 to 20

Etching liquid compositions were obtained by mixing the components shown in Table 2 at the blending proportions shown in Table 2. Moreover, water was a component of the etching liquid compositions in addition to the components shown in Table 2. In addition, the units for the blending proportions of the components shown in Table 2 are mass %, and the concentration of ferric chloride is the concentration in terms of ferric ions and the concentration of cupric chloride is the concentration in terms of cupric ions.

TABLE 2

| Comparative Example No. | Component (A) Ferric chloride | Component (A) Cupric chloride | Component (B) Hydrogen chloride | Others 1,4-di-hydroxy-benzene | Others 1,2-di-hydroxy-benzene | Others Sodium salicylate |
|---|---|---|---|---|---|---|
| 1 | 1 | — | 1 | 1 | — | — |
| 2 | 1 | — | 15 | 1 | — | — |
| 3 | 1 | — | 15 | 10 | — | — |
| 4 | 25 | — | 1 | 10 | — | — |
| 5 | 25 | — | 10 | 10 | — | — |
| 6 | — | 1 | 1 | 1 | — | — |
| 7 | — | 1 | 1 | 10 | — | — |
| 8 | — | 1 | 15 | 1 | — | — |
| 9 | — | 1 | 15 | 10 | — | — |
| 10 | — | 25 | 1 | 1 | — | — |
| 11 | 1 | — | 15 | — | — | — |
| 12 | — | 1 | 15 | — | — | — |
| 13 | 25 | — | 1 | — | 0.5 | — |
| 14 | 25 | — | 1 | — | 1 | — |
| 15 | — | 25 | 1 | — | 0.5 | — |
| 16 | — | 25 | 1 | — | 1 | — |
| 17 | 25 | — | 1 | — | — | 0.1 |
| 18 | — | 25 | 1 | — | — | 1 |
| 19 | 25 | — | 1 | — | — | 0.1 |
| 20 | — | 25 | 1 | — | — | 1 |

The etching liquid compositions obtained in the working examples and comparative examples mentioned above were evaluated in terms of stability and etching performance in accordance with the methods described below.

(Evaluation of Stability)

Stability was evaluated by placing an etching liquid composition in a sealed glass bottle, allowing the composition to stand for 60 minutes at atmospheric pressure and a temperature of 35° C., and then confirming visually whether or not precipitates had been generated.

(Evaluation of Etching Performance)

A multilayer coating film was formed by laminating an ITO layer (50 nm), a Cu layer (200 nm) and a CuNiTi layer (30 nm) in that order on a PET base having a thickness of 200 µm. Next, a test piece was obtained by forming a resist pattern having a width of 40 µm and an opening size of 20 µm on the multilayer coating film using a dry film resist, and then cutting to a size of 20 mm wide by 20 mm long. This test piece was etched by means of a dipping method using an etching liquid composition. The etching treatment was carried out at an etching temperature of 35° C. while stirring the etching liquid composition. The etching duration is shown in Table 3. Following the etching treatment, a wiring pattern was obtained by removing the resist pattern using a stripping liquid.

The width of (the top part of) the obtained wiring pattern was measured using a laser microscope, and the difference between the width of the resist pattern and the width of the wiring pattern was determined. A comparison was made by calculating the difference between the width of the resist pattern and the width of the wiring pattern as an absolute value ($L^1$). As this absolute value ($L^1$) approaches 0, the difference between the width of the resist pattern and the width of the wiring pattern decreases, which means that a wiring pattern having a high dimensional accuracy has been obtained. Conversely, as this absolute value ($L^1$) increases, the difference between the width of the resist pattern and the width of the wiring pattern increases, which means that a wiring pattern having a low dimensional accuracy has been obtained. Moreover, the etching liquid compositions of Comparative Examples 13 to 16, 18 and 20 generated precipitates in the stability evaluation, meaning that it was not possible to carry out etching performance evaluations.

These evaluation results are shown in Table 3.

TABLE 3

| | No. | Stability evaluation (presence/absence of precipitates) | Etching performance evaluation | |
|---|---|---|---|---|
| | | | Etching duration (sec) | $L^1$ (µm) |
| Working Example | 1 | None | 50 | 1.35 |
| | 2 | None | 50 | 1.52 |
| | 3 | None | 60 | 0.69 |
| | 4 | None | 50 | 0.84 |
| | 5 | None | 20 | 4.42 |
| | 6 | None | 40 | 4.40 |
| | 7 | None | 50 | 2.40 |
| | 8 | None | 40 | 2.07 |
| | 9 | None | 30 | 2.84 |
| | 10 | None | 30 | 2.95 |
| | 11 | None | 30 | 2.86 |
| | 12 | None | 40 | 2.51 |
| | 13 | None | 50 | 3.49 |
| | 14 | None | 60 | 1.83 |
| | 15 | None | 40 | 2.77 |
| | 16 | None | 10 | 5.10 |
| | 17 | None | 20 | 7.51 |
| | 18 | None | 20 | 3.63 |
| | 19 | None | 10 | 3.74 |
| | 20 | None | 20 | 9.32 |
| | 21 | None | 20 | 3.87 |
| | 22 | None | 20 | 4.71 |
| | 23 | None | 30 | 4.00 |
| | 24 | None | 30 | 4.32 |
| Comparative Example | 1 | None | 50 | 4.05 |
| | 2 | None | 30 | 11.79 |
| | 3 | None | 50 | 8.48 |
| | 4 | None | 40 | 10.49 |
| | 5 | None | 30 | 4.61 |
| | 6 | None | 50 | 5.29 |
| | 7 | None | 60 | 3.14 |
| | 8 | None | 20 | 13.11 |
| | 9 | None | 20 | 16.43 |
| | 10 | None | 20 | 11.16 |
| | 11 | None | 20 | 9.21 |
| | 12 | None | 10 | 8.51 |
| | 13 | Black precipitate | — | — |
| | 14 | Black precipitate | — | — |
| | 15 | Black precipitate | — | — |
| | 16 | Black precipitate | — | — |
| | 17 | None | 30 | 15.02 |
| | 18 | White precipitate | — | — |
| | 19 | None | 30 | 10.52 |
| | 20 | White precipitate | — | — |

As shown in Table 3, the etching liquid compositions of Working Examples 1 to 24 and Comparative Examples 1 to 12, 17 and 19 did not generate precipitates, and were therefore understood to exhibit high stability. Conversely, the etching liquid compositions of Comparative Examples 13 to 16, 18 and 19 generated precipitates, and were therefore understood to exhibit low stability.

In addition, comparing examples having the same etching conditions (and especially the same etching duration), the etching liquid compositions of Working Examples 1 to 24 produced lower absolute values ($L^1$) than the etching liquid compositions of Comparative Examples 1 to 12, 17 and 19. In particular, the etching liquid compositions of Working Examples 1 to 4 and 14 produced absolute values ($L^1$) of less than 2 µm, and were therefore understood to be able to form wiring patterns having high dimensional accuracy.

As can be understood from the results above, this invention can provide an etching liquid composition and an etching method that allow the formation of a wiring pattern that has the desired dimensional accuracy, while also providing high stability and impeding the generation of precipitates.

Moreover, the present international application claims priority on the basis of Japanese Patent Application No. 2015-209028, which was filed on 23 Oct. 2015, and all the details of that application are incorporated in the present international application.

The invention claimed is:

1. An etching liquid composition, used for etching a coating film that includes a copper-based layer, consisting of an aqueous solution, wherein the aqueous solution comprises:
(A) 0.1 to 30 mass % of at least one oxidizing agent selected from the group consisting of ferric ions and cupric ions;
(B) 0.1 to 20 mass % of hydrogen chloride; and
(C) 0.01 to 25 mass % of 1,3-dihydroxybenzene.

2. The etching liquid composition according to claim 1, wherein the coating film is a multilayer coating film that includes at least one indium oxide-based layer and at least one copper-based layer.

3. The etching liquid composition according to claim 2, wherein the etching is one-step etching.

4. The etching liquid composition according to claim 1, wherein the etching is one-step etching.

5. An etching method for etching a coating film, which includes a copper-based layer formed on a base, by using an etching liquid composition consisting of an aqueous solution, wherein the aqueous solution comprises:
  (A) 0.1 to 30 mass % of at least one oxidizing agent selected from the group consisting of ferric ions and cupric ions;
  (B) 0.1 to 20 mass % of hydrogen chloride; and
  (C) 0.01 to 25 mass % of 1,3-dihydroxybenzene.

6. The etching method according to claim 5, wherein the coating film is a multilayer coating film that includes at least one indium oxide-based layer and at least one copper-based layer.

7. The etching method according to claim 6, wherein the etching is one-step etching.

8. The etching method according to claim 5, wherein the etching is one-step etching.

* * * * *